United States Patent
Posse

(10) Patent No.: US 9,116,219 B1
(45) Date of Patent: Aug. 25, 2015

(54) SYSTEM AND METHODS FOR IMPROVED REAL TIME FUNCTIONAL MAGNETIC RESONANCE IMAGING

(71) Applicant: STC.UNM, Albuquerque, NM (US)

(72) Inventor: Stefan Posse, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 516 days.

(21) Appl. No.: 13/655,295

(22) Filed: Oct. 18, 2012

Related U.S. Application Data

(60) Provisional application No. 61/549,905, filed on Oct. 21, 2011, provisional application No. 61/657,717, filed on Jun. 8, 2012.

(51) Int. Cl.
*G01V 3/00* (2006.01)
*G01R 33/56* (2006.01)

(52) U.S. Cl.
CPC .................................. *G01R 33/5608* (2013.01)

(58) Field of Classification Search
CPC ............... G01R 33/5608; A61B 5/055; G06T 2207/10088
USPC .......................................................... 324/309
See application file for complete search history.

(56) References Cited

U.S. PATENT DOCUMENTS

| | | | | |
|---|---|---|---|---|
| 5,657,758 | A * | 8/1997 | Posse et al. | 600/413 |
| 5,709,208 | A * | 1/1998 | Posse et al. | 600/410 |
| 8,981,776 | B2 * | 3/2015 | Setsompop et al. | 324/309 |
| 2011/0254548 | A1 * | 10/2011 | Setsompop et al. | 324/309 |
| 2011/0260726 | A1 * | 10/2011 | Techavipoo et al. | 324/309 |
| 2013/0342206 | A1 * | 12/2013 | Ugurbil | 324/309 |
| 2014/0002077 | A1 * | 1/2014 | Deshpande et al. | 324/309 |
| 2014/0002078 | A1 * | 1/2014 | Chen et al. | 324/309 |
| 2014/0225612 | A1 * | 8/2014 | Polimeni et al. | 324/309 |
| 2014/0343399 | A1 * | 11/2014 | Posse | 600/410 |

OTHER PUBLICATIONS

Lin et al., 'Physiological noise reduction using volumetric functional magnetic resonance inverse imaging', Human Brain Mapping vol. 33, pp. 2815-2830, Sep. 23, 2011.
Mansfield et al. 'Echo-volumar imaging', MAGMA 1994 vol. 2, pp. 291-294.
Mansfield et al., 'Volumnar imaging using NMR spin echoes: echo-volumnar imaging EVI at 0.1T', J Phys E 1989, vol. 22, pp. 324-330.
Rabrait et al. 'High temporal resolution functional MRI using parallel echo volumar imaging', J Magn Reson Imaging, Apr 27, 2008, vol. 4, pp. 744-753.
Song et al. 'Echo-volume imaging', Magn Reson Med 1994 vol. 32, No. 5, pp. 668-671.
Van Der Zwaag et al., 'Improved echo volumar imaging (EVI) for functional MRI', Magn Reson Med. Dec. 2006, vol. 56, pp. 1320-1327.
Yang et al. 'Localized echo-volume imaging methods for functional MRI', J Magn Reson Imaging 1997, vol. 7, No. 2, pp. 371-75.

* cited by examiner

*Primary Examiner* — Rodney Fuller
(74) *Attorney, Agent, or Firm* — Valauskas Corder LLC

(57) ABSTRACT

A system and methods for high-speed functional magnetic resonance imaging using multi-slab echo-volumar imaging (EVI), specifically a combination of multi-slab excitation and single-shot 3D encoding with parallel imaging to reduce geometrical image distortion and blurring, and to increase blood oxygenation level-dependent (BOLD) sensitivity compared to conventional echo-planar imaging (EPI).

8 Claims, 9 Drawing Sheets

Figure 1
Slab 1                              Slab 2
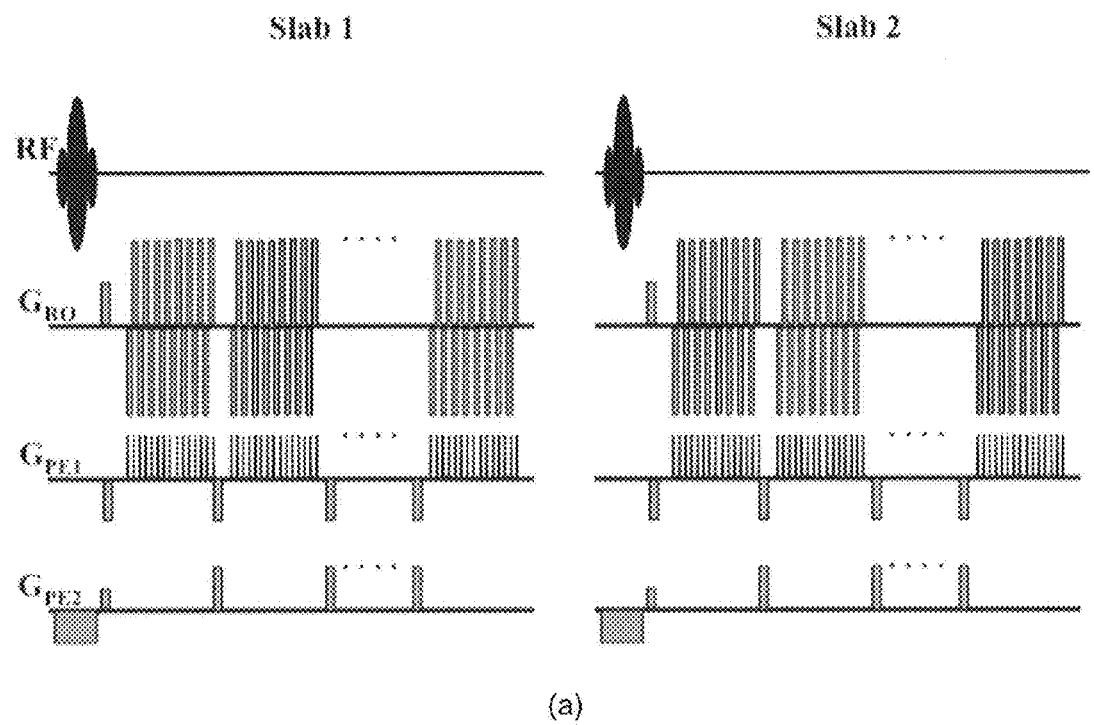
(a)
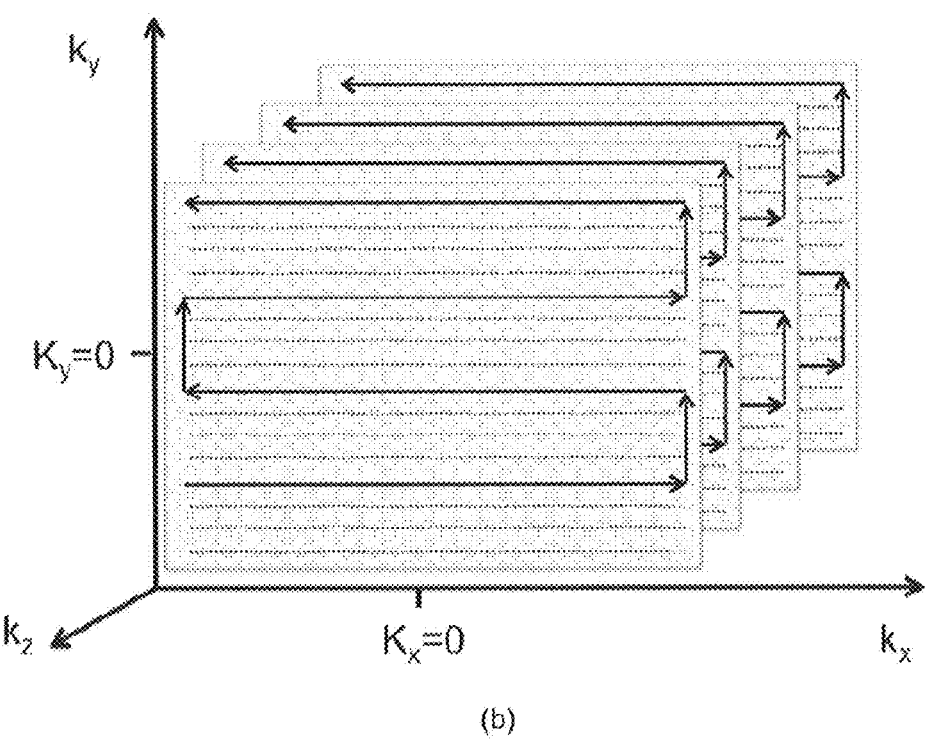
(b)

Figure 4
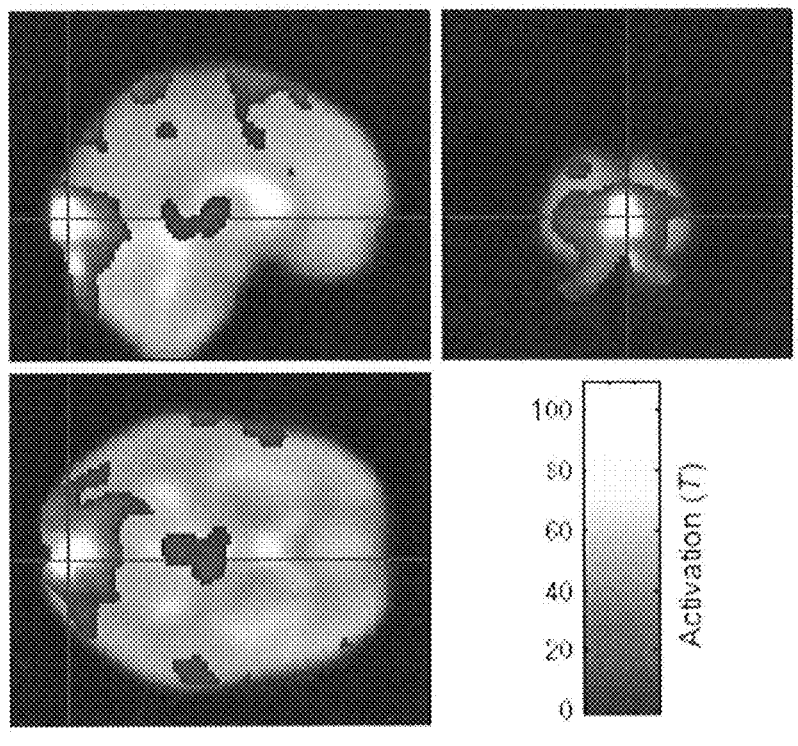
(a)
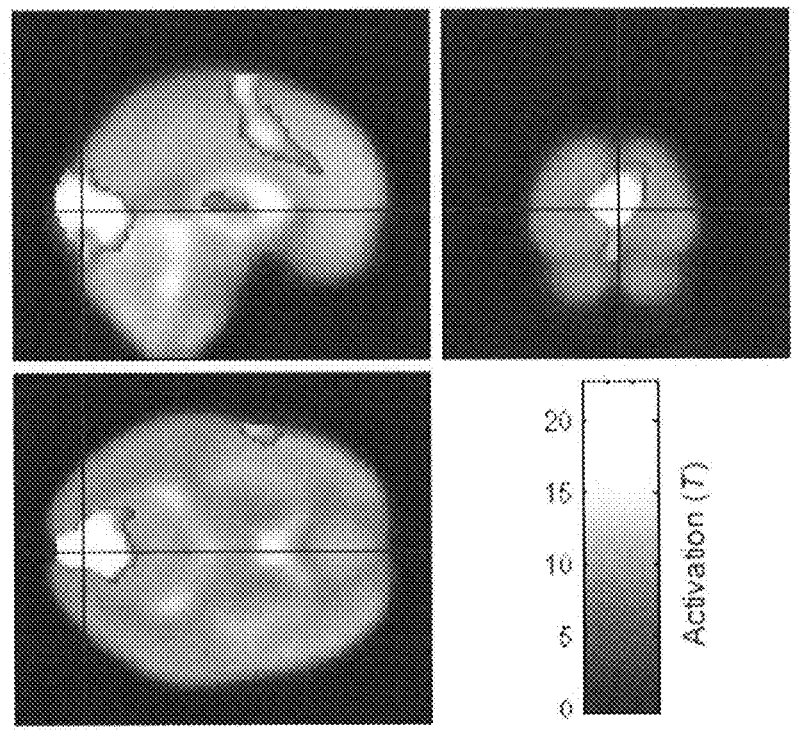
(b)

Figure 10
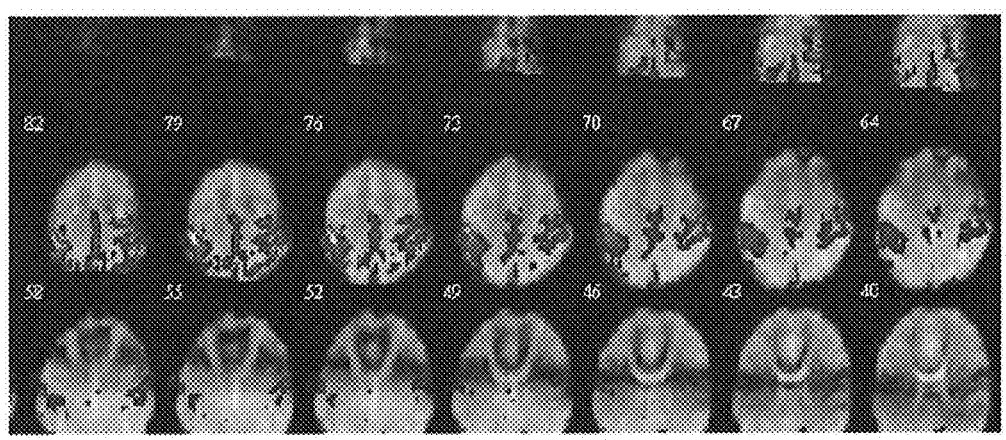
(a)
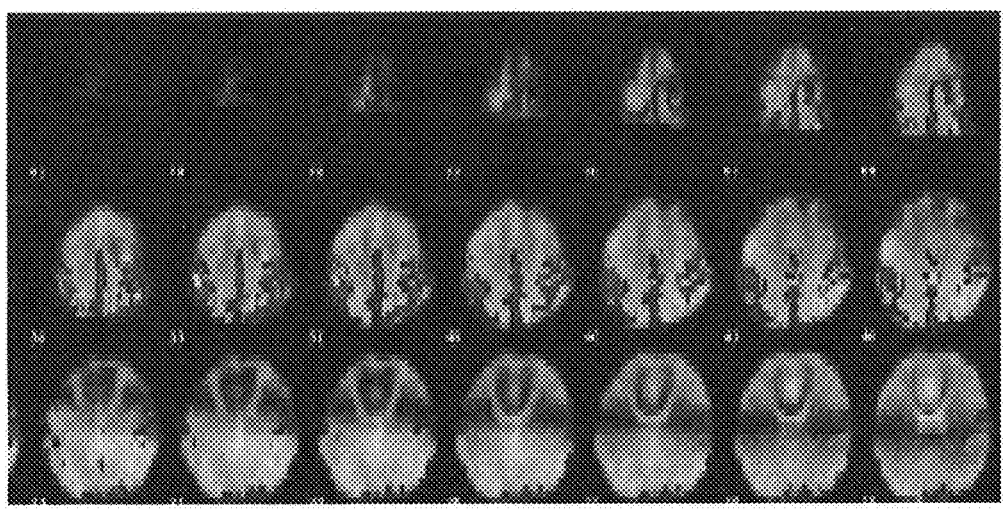
(b)
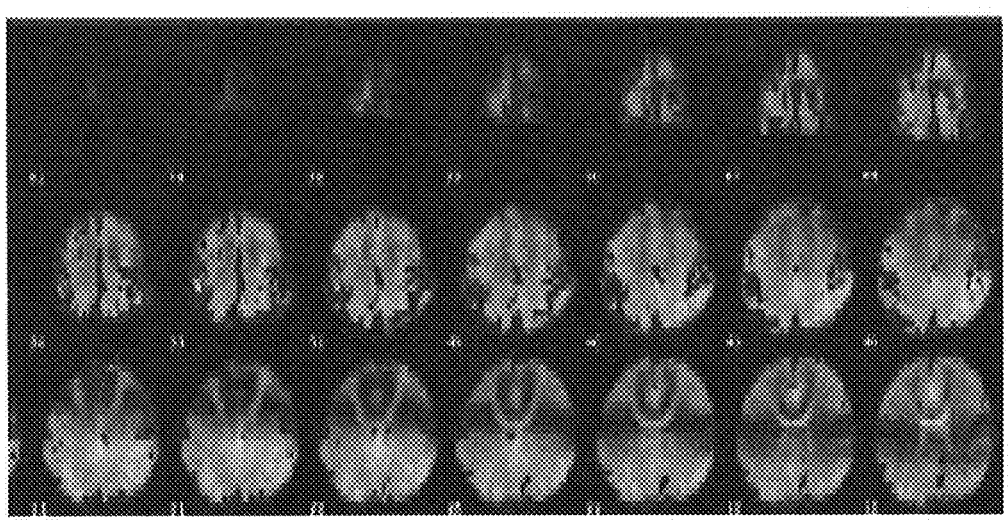
(c)

SYSTEM AND METHODS FOR IMPROVED REAL TIME FUNCTIONAL MAGNETIC RESONANCE IMAGING

CROSS-REFERENCE TO RELATED APPLICATIONS

This application claims priority to U.S. Provisional Application No. 61/549,905, filed Oct. 21, 2011, and U.S. Provisional Application No. 61/657,717, filed Jun. 8, 2012, each of which is incorporated by reference herein in its entirety.

STATEMENT REGARDING FEDERALLY SPONSORED RESEARCH

This invention was made with government supported under grant R01 EB002618 awarded by the National Institutes of Health. The United States Government has certain rights in the invention.

FIELD OF THE INVENTION

The present invention relates generally to functional magnetic resonance imaging (fMRI), and more specifically to improved system and methods for fMRI using multi-slab echo-volumar imaging (EVI) to reduce geometrical image distortion and blurring, and increase blood oxygenation level-dependent (BOLD) sensitivity compared to conventional echo-planar imaging (EPI).

BACKGROUND OF THE INVENTION

Echo-planar imaging (EPI) using blood oxygenation dependent (BOLD) contrast is widely used for functional MRI (fMRI) in Neuroscience and Clinical research applications. Although EPI is capable of sampling the time course of the hemodynamic response with a standard temporal resolution of 2-3 seconds for whole brain mapping and with correspondingly faster temporal resolution for partial brain coverage, there is increasing interest in achieving order of magnitude faster sampling rates for whole brain mapping to resolve heartbeat-related physiological signal fluctuation to increase sensitivity in event related fMRI, to reduce sensitivity to intra-scan head movement and to measure regional onset differences of the hemodynamic responses without resorting to jittering the task paradigm.

Recent developments of high-speed fMRI include single-shot echo-volumar imaging (EVI), Inverse Imaging (InI), highly under-sampled projection imaging (PI) and more recently multiplexed EPI or fast volumetric imaging based on single-shot 3D rosette trajectories, all of which enable temporal resolution on the order of 100 ms or less. A recent study using InI demonstrated considerable improvements in hemodynamic response estimation using a moving average filter to suppress physiological noise.

Echo-volumar imaging (EVI), one of the first 3D single-shot imaging techniques, was included in the first description of EPI. The method has been challenged by the inability of whole body gradient systems to encode 3D k-space sufficiently rapidly, resulting in geometrical image distortion, signal dropouts and spatially varying blurring of the point spread function due to magnetic field inhomogeneity and transverse signal relaxation. Using the improved gradient performance afforded by a dedicated head gradient system, EVI was demonstrated with a 64×32×7 matrix and 3.8 mm×6.3 mm×5 mm spatial resolution with a readout duration of 70 ms. Using local excitation to achieve partial brain coverage, a 64×64×10 matrix with 3.75 mm×5 mm×5 mm voxel size was demonstrated.

After this initial phase of feasibility studies in the 1990s using 1.5 T scanners, there has been renewed interest in recent years. An improved version of EVI has been introduced that uses reduced field of view (FOV) encoding, outer volume suppression and a surface coil at 3 Tesla. Integration of parallel imaging has led to considerable improvement in image quality and proof-of-concept at 7 Tesla. A variant of EVI using a square spiral with 14×14×14 spatial matrix and 14 mm voxel dimensions enables detection of the negative dip across the brain with 100 ms temporal resolution.

Although increasing the temporal resolution of fMRI is the principal goal, the increased efficiency (SNR per unit time) of 3D versus 2D encoding makes EVI attractive. EVI is also considerably less sensitive to physiological noise than segmented 3D EPI methods, which are affected by signal fluctuations between segments that lead to ghosting and increase apparent physiological signal fluctuation.

Despite the technical advances, the need for specialized hardware, persistent image quality constraints due to geometrical image distortion, blurring and signal drop outs that are exacerbated by head movement, as well as signal drifts due to gradient instability and steady-state effects remain considerable challenges for routine applications, in particular at high magnetic field strength. Practical applications of EVI are also hampered by time-consuming image reconstruction of large amount of data generated by EVI such that there is a need for real-time fMRI with EVI. The present invention satisfies these needs.

SUMMARY OF THE INVENTION

The present invention is directed to a system and methods for high-speed fMRI using multi-slab echo-volumar imaging (EVI). Combination of multi-slab excitation and single-shot 3D encoding with parallel imaging within each slab reduces geometrical image distortion and blurring, and increases BOLD sensitivity compared to conventional echo-planar imaging (EPI). Specifically, the present invention is directed to a system and methods for EVI using multi-slab excitation and single-shot 3D encoding with generalized auto calibrating partially parallel acquisition (GRAPPA), partial parallel imaging within each slab to strongly reduce geometrical distortion and blurring while only moderately reducing temporal resolution compared to single-shot EVI. Although parallel imaging with GRAPPA is a preferred embodiment, it is contemplated that parallel imaging reconstruction can use sensitivity encoding (SENSE) as a preferred alternative implementation.

A temporal resolution of 286 ms is demonstrated for whole brain acquisition (4 mm isotropic voxel size) and 136 ms for partial brain acquisition (4×4×6 $mm^3$ voxel size) on a conventional clinical 3T scanner equipped with 12-channel head coil. Although the present invention is discussed herein with respect to the brain, any human anatomy is contemplated.

Real-time image reconstruction is implemented using in-plane reconstruction with GRAPPA on the scanner and reconstruction in the 3rd spatial dimension on an external workstation enabling real-time fMRI analysis with time delays of less than 100 ms. BOLD sensitivity is compared including mean and maximum percent signal change, mean and maximum t-score, extent of activation and temporal signal-to noise ratio (tSNR) of whole-brain multi-slab EVI with 286 ms temporal resolution and multi-slice EPI across several tasks that engage functional brain networks in visual, auditory, motor and frontal cortex. Time domain moving average filtering to suppress physiological noise from cardiac and respiratory fluctuations further improved mean and maximum t-scores and increased extents of activation compared to EPI. A higher temporal resolution of 136 ms is used to resolve heartbeat-correlated physiological signal fluctuation to improve sampling of the time course of BOLD signal changes in brief visual-motor tasks and in event-related fMRI using a number/counting Stroop task. Feasibility of mapping major resting state networks (RSN) with 136 ms temporal resolution is assessed, which benefits from using faster sampling rates.

Feasibility of high temporal resolution real-time fMRI using multi-slab EVI on a standard clinical MR scanner is demonstrated by the present invention. The high BOLD sensitivity of multi-slab EVI is advantageous for real-time detection of event-related fMRI signal changes, for separation of physiological noise components and for detecting resting state networks in short scan times. High sensitivity for measuring brain activation in short scans is highly desirable for fMRI studies in children and in many clinical populations, such as patients with movement and neurodegenerative disorders. Multi-slab EVI has the potential to become an alternative to EPI as the accelerating development of parallel imaging, compressed sensing and large-scale array coils transforms clinical imaging.

BRIEF DESCRIPTION OF THE DRAWINGS

The preferred embodiments of the invention will be described in conjunction with the appended drawings provided to illustrate and not to limit the invention, where like designations denote like elements, and in which:

FIG. 1 illustrates a schematic diagram of the multi-slab echo-volumar imaging (EVI) sequence and K-space trajectory for each slab according to one embodiment of the present invention;

FIG. 4 illustrates single-subject activation maps of a visual-motor task overlaid on the Montreal Neurological Institute (MNI) template brain according to one embodiment of the present invention;

FIG. 10 illustrates sensorimotor resting state networks detected in a single subject using 2-slab EVI for different scan durations according to one embodiment of the present invention.

DETAILED DESCRIPTION

Figure 2:
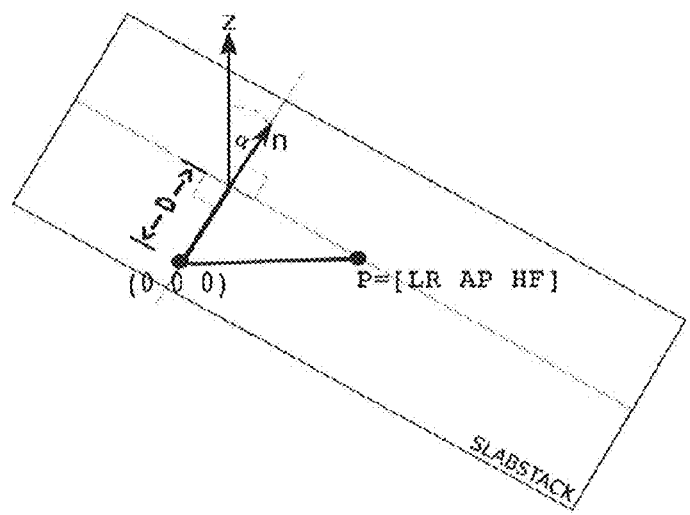
FIG. 2 illustrates the computation of the offset of the slab stack according to one embodiment of the present invention.

Data was collected for fifteen healthy subjects on a clinical Siemens 3T TIM Trio scanner equipped with Avanto gradient system and 12-channel array receive only head coil. Pulse and respiration waveforms were recorded with 100 ms temporal resolution. Reconstructed 2D images were exported from the scanner reconstruction computer via the scanner host computer to an external Intel Xeon E5530, 6 core, 2.4 GHz workstation for reconstruction of the $3_{rd}$ spatial dimension and real-time fMRI analysis.

The EVI pulse sequence, which was based on a multi-echo EPI (MEPI) sequence with flyback along the $k_z$-direction is shown in FIG. 1. Multiple adjacent slabs were excited sequentially and encoded in a single temporal resolution (TR) using repeated EPI modules with interleaved phase encoding gradients. As shown more specifically in FIG. 1(a), the EPI modules consisted of trapezoidal oscillating gradients ($G_{RO}$) along the readout direction and a series of blipped primary phase encoding gradients ($G_{PE1}$) that were rewound at the end of every partition and a blipped secondary phase encoding gradient ($G_{PE2}$) that encodes the third spatial dimension was applied after each EPI module. $K_z$-space was encoded symmetrically using a de-phasing gradient before the first EPI module ($k_{max}/2$). FIG. 1(b) illustrates the K-space trajectory for each slab with 4-fold acceleration in the $k_y$-direction. More specifically, the $k_x$-$k_y$ space trajectories for each $k_z$ step were traversed in the same direction using 4-fold acceleration for GRAPPA reconstruction. GRAPPA auto-calibration signal (ACS) lines for in-plane GRAPPA reconstruction were acquired in a prescan and were fully sampled in a user-controllable resolution.

Encoding of 8 slices per slab with 64×64 in-plane matrix was performed using 4-fold GRAPPA acceleration, 6/8 partial phase encoding, 2790 Hz/pixel readout bandwidth, trapezoidal readout gradients with ramp sampling and 4 mm in-plane resolution. The minimum effective echo time (TE) of 28 ms for this readout corresponds to the TE routinely used with EPI sequences, which minimizes signal drop-out in frontal lobe. The corresponding readout duration was 52 ms, which is approximately 1.5×$T_2$* in cortex and provides close to optimum BOLD sensitivity, while minimizing the degree of geometrical through-plan distortion in frontal lobe. Using 4-fold $k_y$-space under-sampling with 256 mm target field of view (FOV) resulted in approximately 3-fold aliasing of the brain with typical head sizes. The "effective" GRAPPA acceleration in this configuration was thus 3-fold, which results in acceptable parallel imaging noise enhancement. In-plane ghosting was less than 5% in phantoms, similar to that of non-accelerated EPI. Numerically optimized slab selection RF pulses and spatial oversampling of 1 slice on either side of each slab were used to minimize inter-slab crosstalk, to avoid spatial aliasing and to minimize signal losses at the slab edges. The bandwidth of the RF excitation pulse was increased almost 2-fold (time-bandwidth product: 10) and the duration of the RF pulse was decreased 4-fold from 2560 us of the product sequence down to 640 us to improve the slice profile and to minimize chemical shift and susceptibility related slab displacement.

High-resolution $T_1$-weighted Magnetization Prepared RApid Gradient Echo (MPRAGE) scans were acquired for spatial referencing using TR: 1810 ms, Inversion Time (TI): 900 ms, TE: 2.52 ms, flip angle: 8°, bandwidth: 651 Hz/Px, 160 or 192 sagittal slices with 256×256 in-plane resolution, and isotropic 1 mm voxel dimensions. Multi-slab EVI data were acquired with two different temporal resolutions: (i) TR=286 ms, $TE_{eff}$=28 ms, α=10°, 4 slabs in AC/PC orientation, interleaved acquisition order, slab thickness=24 mm, inter-slab gap=10%, matrix per slab=64×64×8, Field of View (FOV) per slab=256×256×32 mm³, reconstructed isotropic voxel dimensions=4 mm, scan time=172 s, number of scans=600 and (ii) TR=136 ms, $TE_{eff}$=28 ms, α=10°, 2 slabs in AC/PC orientation, slab thickness=42 mm, inter-slab gap=10%, matrix per slab=64×64×8, FOV per slab=256× 256×48 mm³, reconstructed voxel dimensions=4×4×6 mm³. Task activation data were acquired with scan times of either 107 or 148 s using either 787 or 1100 scan repetitions. Resting state data were acquired with scan time of 4 minutes and 59 s using 2199 scan repetitions.

Fully sampled EPI data were acquired using identical TE, voxel size and scan time as 4-slab EVI data, and TR=2 s. The total number of scans was 86. Thirty-two slices with 0% gap were acquired using interleaved acquisition order.

Five experiments were conducted. In the first experiment, four subjects performed simultaneous visual and motor tasks using a block design paradigm. The visual activation task was eyes open in the lit scanner environment versus eyes closed. The motor task consisted of 2 Hz right hand index finger tapping versus rest. Subjects were asked to tap with maximum extension of the index finger. Start and stop of task execution was initiated by short beeps. The task duration was 4 s and the inter-stimulus interval was 23. The tasks were repeated 5 times. Data were acquired with 4-slab EVI using a TR of 286 ms and with EPI using a TR of 2 s.

The second experiment included three subjects that performed a multi-task paradigm that consisted of four interleaved tasks: (1) visual, (2) motor, (3) auditory, and (4) cognitive. These tasks were arranged in a randomized block design (8 s per block), with a crosshair serving as baseline for a total of 132 s per scan. The total duration for each condition was approximately 27 s. Visual stimulation consisted of black and white checkerboards. Finger tapping in the motor task was paced with an auditory tone (1 kHz). Subjects were asked to tap with maximum extension of the finger. During the auditory task, subjects listened to recorded syllables (i.e., "Ah, Ba, Ha, Ka, Ra, . . . ") and pressed a button when they heard the target syllable "Ta" (25% of syllables). The cognitive task consisted of mental calculations. Subjects were asked to sum three aurally presented numbers and divide the sum by three, responding with a button press when the sum was integer-divisible by three (50% of trials). Data were acquired with 4-slab EVI using a TR of 286 ms and with EPI using a TR of 2 s.

Three subjects in a third experiment performed simultaneous visual and motor tasks using a block design paradigm. Visual stimulation consisted of checkerboard display versus crosshair. The motor task consisted of 2 Hz right hand index finger tapping versus rest. Subjects were asked to tap with maximum extension of the index finger. Start and stop of task execution was initiated by short beeps. The task duration was 4 s and the inter-stimulus interval was 23. The tasks were repeated 5 times. Data were acquired with 2-slab EVI using a TR of 136 ms.

In the fourth experiment, two subjects performed a number/counting Stroop task with button response that consisted of 12 single trials with 950 ms activation block duration and 8.4 s inter-stimulus intervals. On each trial, participants were visually presented with numerical stimuli—either 'ONE', 'TWO' or 'THREE'—, written either one, two or three times in a row. In alternating blocks, participants were instructed to indicate either the numerical value of the presented number, or the number of times the number was presented. In congruent trials the 'numerical value' and 'numerical count' were the same. In incongruent trials the 'numerical value' and 'numerical count' were different. Six congruent and 6 incongruent trials in randomized order were performed within a single scan. Two scans were measured in each subject. Data were acquired with 2-slab EVI using a TR of 136 ms.

In the fifth experiment, four subjects participated in resting state scans with eyes open, which lasted 4 min and 59 s. They were instructed to relax, clear their minds and fixate on a crosshair. Data were acquired with 2-slab EVI using a TR of 136 ms.

In-plane ($k_x$, $k_y$) reconstruction of complex images including magnitude and phase for each encoded $k_z$ step and slab was performed online on the scanner. Real-time export of magnitude and phase images to the external workstation was performed using the Adaptive Communication Environment (ACE) library for TCP/IP communication and socket stream. ACE is a freely available, open-source object-oriented framework that implements many core patterns for concurrent communication software. Image reconstruction in the $k_z$ dimension on the external workstation included Hamming filtering, Fourier transformation, slice ordering and concatenation of stacks of slices from different slabs to form contiguous 3D image volumes. The time delay from acquisition to display of reconstructed images was less than TR.

Slice ordering consisted of the following steps: (i) The offset (D) of the stack of slabs from the magnet center was computed based on the slab prescription on the scanner console, which includes the offset of the center of the slabstack (P) with respect to the magnet center along the principal axes: right-left (RL), anterior-posterior (AP) and head-foot (HF), and the slab rotation angles α around the RL axis and β around the AP axis, as well as the slice thickness (SLT). This involves computing the normal unit vector of the slabstack ($\vec{n}$) using Euler rotation matrices, projecting the position vector $\vec{P}$ onto $\vec{n}$ as shown in FIG. 2, and adjusting a half-slice offset to account for the digitization of the slices:

$$D = RL\cos(\alpha)\sin(\beta) - AP\sin(\alpha) + HF\cos(\alpha)\cos(\beta) - 0.5 \cdot SLT \quad \text{Equation (1)}$$

(ii) D determines the aliasing of reconstructed slices along the slice direction within the encoded FOV ($FOV_z$), which was accounted for by a circular shift of the stack of slices for each slab. (iii) Slices at the edge of the slab were included, if their overlap with the slab exceeded a user-selected fraction of the slice thickness (30%).

An approximation of the spatial signal-to-noise ratio was obtained by computing the ratio of the mean signal intensity inside brain and the standard deviation of noise outside of the brain in a region that was free of ghosting, scaled by 0.655 to account for the Rayleigh distribution of signals within the noise region.

Online and offline fMRI analysis was performed. Preprocessing includes performance optimized rigid body motion correction, slice time correction in case of EPI and spatial normalization into Montreal Neurological Institute (MNI) space. EVI data were additionally processed with a moving average digital filter. The filter width was chosen to be 2 s, which was shown to be optimal for estimating the hemodynamic response and coincides with the TR of the EPI data. Image data were segmented into 144 functional brain regions in Talairach space based on the Talairach Daemon database and Mathew Brett's formula MNI=([1.14X+0.8],[1.03Y+3.32],[1.14Z+0.05Y+0.44]). Statistical analysis consists of simultaneous cumulative General-Linear-Model analysis and cumulative correlation analyses with up to 6 individually modeled reference vectors convolved with a canonical 6 parameter hemodynamic response model. Up to 6 signal time courses from either manually selected regions-of-interest (ROIs) or automatically selected volumes-of-interest (VOIs) were displayed using the 144 predefined functional areas.

The normalized raw image data and the t-maps for the first and third experiments were labeled with Talairach coordinates for each voxel, automatically segmented into 144 predefined functional areas and further processed using scripts written in Perl. The maximum and the mean BOLD signal amplitude (average of percent signal change from baseline to maximum BOLD signal in individual blocks of activation), the maximum and the mean t-score, and the extent of activation were measured in visual cortex (BA17-19) and in extended motor cortex (BA1-6). Voxels with less than 50% of maximum signal intensity within target regions were excluded to remove edges. For the first experiment, only voxels that were consistently activated in all EVI and EPI scans of a given subject were selected for measuring percent signal change and t-scores to ensured identical VOI selection across all EVI and EPI scans of a subject. The t-score threshold for activation detection in visual cortex was 5.0. In the extended motor cortex the selected t-threshold was 3.0 to ensure adequate voxel statistics.

The voxel selection for this analysis was further constraint by requiring that the t-threshold was exceeded in each of the EVI and EPI scans of a particular subject, which selected a region with 100% within-subject agreement of activation. The temporal signal to noise ratio (tSNR), which is defined as:

$$tSNR = \mu/\sigma \qquad \text{Equation (2)}$$

where $\mu$ is the mean signal and $\sigma$ is the standard deviation across the time domain, was computed in left Brodmann Area 10 (BA 10 L) for voxels with t-score less than 1.0. Left BA10 was selected, since it did not show paradigm related signal changes as verified using correlation and ROI analysis.

For the second experiment described above, the maximum t-scores and extents of activation in visual cortex (BA17, 18 and 19) for data obtained in the first and third experiments and additionally in motor cortex (BA 1-3), auditory cortex (BA 21 and 22) and frontal cortex (including BA 4, 6, 7, 8, 9, 10, 11, 32, 40 and 46) were computed.

A subset of 4-slab EVI and EPI scans obtained with paradigms 1 and 2 were processed to determine t-thresholds for analysis and to assess maximum t-scores and extents of activation in concatenated scans for single subjects. Processing steps included motion correction, correction for slice timing in case of EPI, spatial normalization, spatial smoothing with 8 mm Gaussian kernel and autoregressive modeling with inclusion of the first derivative. Maximum t-scores and extents of activation of the largest cluster were computed using corrected p-threshold of 0.01. Data acquired in the fourth experiment were analyzed using the same processing steps and uncorrected p-threshold of 0.001.

Spatial independent component analysis (ICA) of the data collected in the fourth and fifth experiments were performed. The ICA algorithm used throughout was Fast ICA since it had previously been shown to be more robust and computationally efficient compared with the competing alternative approaches for fMRI data analysis. The settings used for all data sets were the following: epsilon: $10^{-6}$, maximum number of iterations: 1024, maximum number of fine-tuning sessions: 64, using tan h as the nonlinear transfer function, sampleSize: 1, deflation mode, stabilization: on, and pow3 as "g" function. In order to estimate the data subspace (model selection), minimum description length (MDL) was applied to the raw data after realignment and unwarping. Spatial normalization was applied as co-registration with the EPI.mni template to ensure consistent multi-session and/or multi-subject analysis.

The validation of ICA decomposition was carried so that the most stable directions were selected after statistical resampling (bootstrap) of the raw data. Principal component analysis (PCA) was used for pre-whitening based on singular value decomposition. Back reconstruction of the data was carried out such that the aggregate spatial map was equal to the sum of the spatial maps and the product of the time courses and spatial maps estimated data to match the accuracy of the PCA. A Z-threshold of 1.5 was used to map independent components. Independent components representing the 5 major resting state networks were identified by visual inspection using spatial and temporal selection criteria. Maximum Z-scores in these components were measured.

Mixed linear models with a fixed effect of scan type and random intercepts with unstructured covariance structure were fit to account for the unbalanced repeated measures among subjects. If the null model likelihood ratio test had an insignificant chi-square, then the random intercept was dropped from the model and only the fixed effect was retained. P-values for comparisons between scan types were estimated from the least squares means estimates and the Scheffé correction for multiple comparisons was used where warranted. A limitation of this method is the assumption of normality in these small sample sizes; however, limited methodology exists for small-sample unbalanced repeated measures ANOVA and this analysis proved to be the most robust among alternatives. When plotted, the data appeared to be approximately normally distributed. Significance was held at $\alpha=0.05$. All analysis was performed in SAS v. 9.3.

Figure 3:
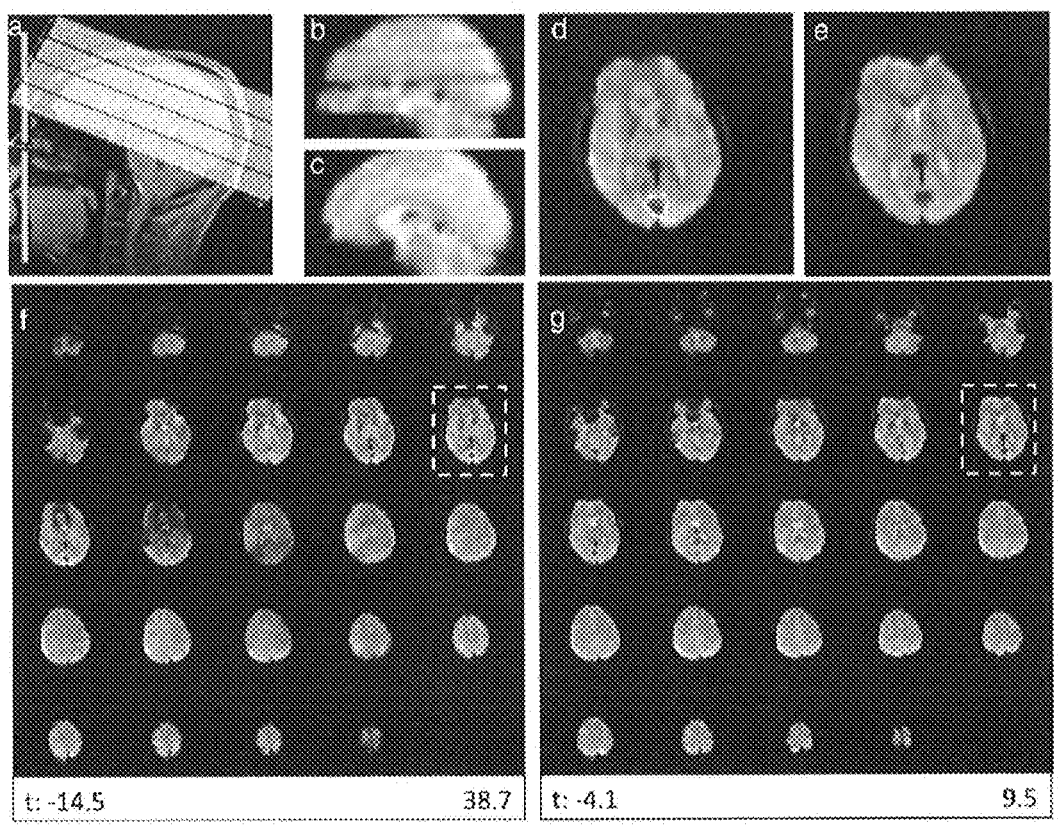
FIG. 3 illustrates a comparison of 4-slab echo-volumar imaging (EVI) and conventional echo-planar imaging (EPI) according to one embodiment of the present invention.

FIG. 3a shows the typical placement of the 4-slab EVI in the human brain. Geometrical distortions were mostly restricted to the ventromedial prefrontal cortex, which was imaged by the most inferior slab (FIG. 3b). Through-plane displacement in that slab was typically on the order of 1 slice or less, but in some subjects the displacement was up to 2 slices, which lead to localized wrap-around effects in the slice direction. EPI exhibited slightly larger in-plane distortion in the prefrontal cortex than 4-slab EVI (FIGS. 3d and 3e). Four-slab EVI and conventional EPI displayed similar in-plane resolution and image uniformity in most slices in upper cerebrum (FIG. 3, f and g). Signal dropout in ventromedial prefrontal cortex was comparable to EPI. Flip angle dependence of BOLD contrast was characterized in vivo at a TR of 286 ms. FMRI sensitivity was slightly larger at 30° flip angle compared to 10° and 90° flip angle, which is close to the Ernst angle (37°) in gray matter at 3 Tesla. However, a 10° flip angle was chosen for both TR: 286 and TR: 136 ms (Ernst angle in gray matter: 26°) to minimize both in-flow effect and signal saturation in CSF spaces at the expense of SNR. As a consequence, high image contrast between brain tissue and ventricles was obtained. Volume coverage with 4-slab EVI (25 reconstructed slices) encompassed upper cerebrum and cerebellum. The gap between the slabs caused three of the reconstructed slices to be 20-40% darker than the adjacent slices depending on the position of the gaps between slabs relative to the encoded slice. After spatial normalization into MNI space multi-slab EVI data were almost indistinguishable from normalized EPI data.

A range of image resolutions, matrix sizes and slab orientations was investigated. Although a minimum in-plane resolution of 3 mm was technically feasible, significant increase in g-factor related noise in the center of the FOV due to the limited spatial encoding capabilities of the 12-channel coil was noted. A 4 mm in plane-resolution was chosen as a compromise to ensure acceptable g-factor related noise enhancement and to minimize ghosting. Acquisition of larger image matrix with up to 12 encoded $k_z$-space lines was investigated. Acceptable image quality was obtained with 64×64×12 matrix and an effective TE of 43 ms, however, increased blurring, ghosting and signal dropout in ventral prefrontal cortex were noted. Data acquired in sagittal orientation were comparable in quality to axially acquired data. However, axial data acquisition was preferred to compare with standard EPI protocols and for partial brain acquisition in the upper cerebrum with TR=136 ms.

Signal stability under steady state conditions was investigated in a cylindrical agarose phantom and in a spherical non-doped water phantom. In the agarose phantom the peak-to-peak signal instability was 0.5%. In the water phantom, oscillatory signal intensity fluctuations up to 2% peak-to-peak with a periodicity of 0.5 Hz were measured at the edges of the slabs, reflecting steady-state effects. Signal drift and displacement along the slice direction due to gradient heating was minor.

Performance tests showed that data acquisition, in-plane image reconstruction of magnitude and phase images, image transfer to the external workstation, reconstruction in the slice direction and real-time fMRI analysis with ROI analysis could be sustained with data rates of up to 240 2-dimensional images per second. The steady-state time delay between data acquisition and update of the activation maps at TR of 136 ms was less than 0.5 s.

With respect to the first experiment, FIG. 4 illustrates single-subject activation maps of a visual-motor task overlaid on the MNI template brain. Specifically, FIG. 4(a) illustrates data obtained with 4-slab EVI with TR of 286 ms and FIG. 4(b) illustrates data obtained with EPI. Activation maps are scaled to maximum t-score, which was considerably larger with 4-slab EVI compared to EPI. Specifically, a maximum t-score of 108.7 was measured in 4-slab EVI compared to 23.6 in EPI. BOLD signal changes and t-scores in visual cortex (Brodman areas 17-19) were significantly larger with 4-slab EVI compared with conventional EPI. Similar results were obtained in the extended motor area (Brodman areas 1-6).

Four-slab EVI of visual and motor tasks significantly increased mean (visual: 96%, motor: 66%) and maximum t-score (visual: 263%, motor: 124%) and mean (visual: 59%, motor: 131%) and maximum (visual: 29%, motor: 67%) BOLD signal amplitude compared with EPI. Time domain moving average filtering (2 s width) to suppress physiological noise from cardiac and respiratory fluctuations further improved mean (visual: 196%, motor: 140%) and maximum (visual: 384%, motor: 200%) t-scores and increased extents of activation (visual: 73%, motor: 70%) compared to EPI.

The average temporal signal-to-noise ratio in left Brodmann area 10, in voxels which were not activated by this task, was 52.1% smaller using 4-slab EVI compared to EPI. After moving average filtering, this difference was reduced to 24.3%. The tSNR across the entire brain, which was measured in one subject, was 128.3. The tSNR in left Brodmann area 10 in this subject was 90.0. The difference in spatial SNR was not significant: 4-slab EVI had an average spatial signal-to-noise ratio (SNR) of 209+/−26, whereas EPI had an average spatial SNR of 207+/−18.

The second experiment as described above used rapid switching between multiple tasks to engage a larger range of functional networks, which confirmed the observation in first experiment. Maximum t-scores were 2-3 times larger with 4-slab EVI compared to EPI and extents of activation were 3-15 times larger with 4-slab EVI compared to EPI, depending on brain region. In visual and auditory cortex these differences were statistically significant. Increases in extent of activation in motor and frontal cortex did not reach statistical significance due to inter-scan and inter-subjects variability partly due to the increased complexity of this interleaved task design compared to the first experiment, which is sensitive to variation in reaction time and changes in attention associated with task switching.

Figure 5:
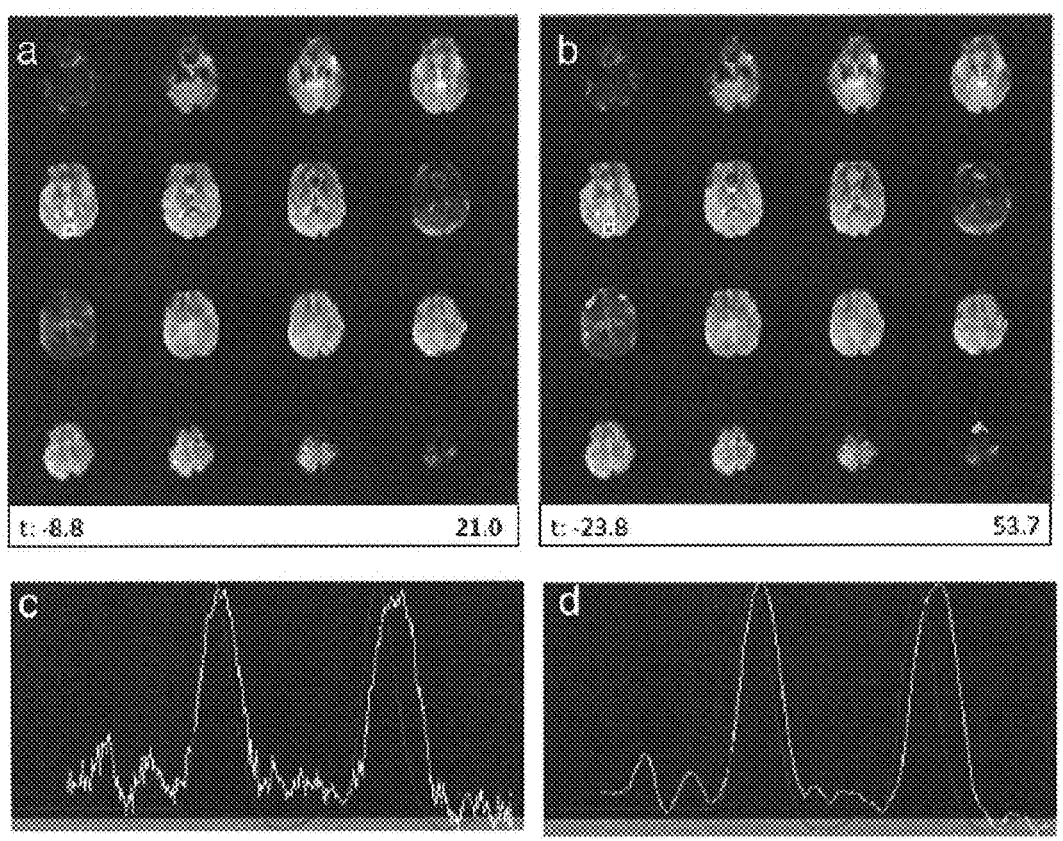
FIG. 5 illustrates real-time fMRI activation map measured during a visual-motor task without and with time domain moving average filter according to one embodiment of the present invention.

Next, event-related fMRI and characterization of physiological noise using 2-slab EVI at was considered. With respect to experiment 3, strong signal changes well above noise level of the same magnitude as with 4-slab EVI were measured in single trials. Specifically, FIG. 5 illustrates real-time fMRI activation maps without and with time a 2 s domain moving average filter measured during a visual-motor task obtained with 2-slab EVI with TR=135 ms. Mean BOLD signal amplitude in Brodmann areas 17-19 and mean and maximum BOLD signal amplitude in Brodmann areas 1-6 were in a similar range as those measured with 4-slab EVI. Mean and maximum t-scores, and extents of activation in these areas were smaller than those measured with 4-slab EVI. The average temporal signal-to-noise ratio in left Brodmann area 10, in voxels which were not activated by this task, was 19% smaller than with 4-slab EVI. The moving average filter significantly increased the mean and maximum t-scores, the extent of activation and the temporal signal to noise ratio, but significantly reduced the mean and the maximum BOLD signal amplitude, consistent with the results obtained using 4-slab EVI. The average spatial SNR was 239+/−23. FIG. 5(a) illustrates raw images with an overlaid activation map without moving average filter.

As seen in FIG. 5(b), the moving average filter strongly reduced noise and the signal time course in visual cortex (Brodman Areas 17 and 18) with overlaid 6-parameter canonical hemodynamic response function provided an almost perfect fit of the BOLD signal time course leading to very high correlation coefficients close to unity. Deviations from the canonical response function likely represent delayed reaction time and non-task-related brain activation, such as visual imagery and visual after-effects. Furthermore, the fast acquisition speed of multi-slab EVI reduced the effects of intrascan movement and improved the identification of non-BOLD noise sources. For example, small sub-second head movement was clearly identifiable in the time domain data.

Figure 6:
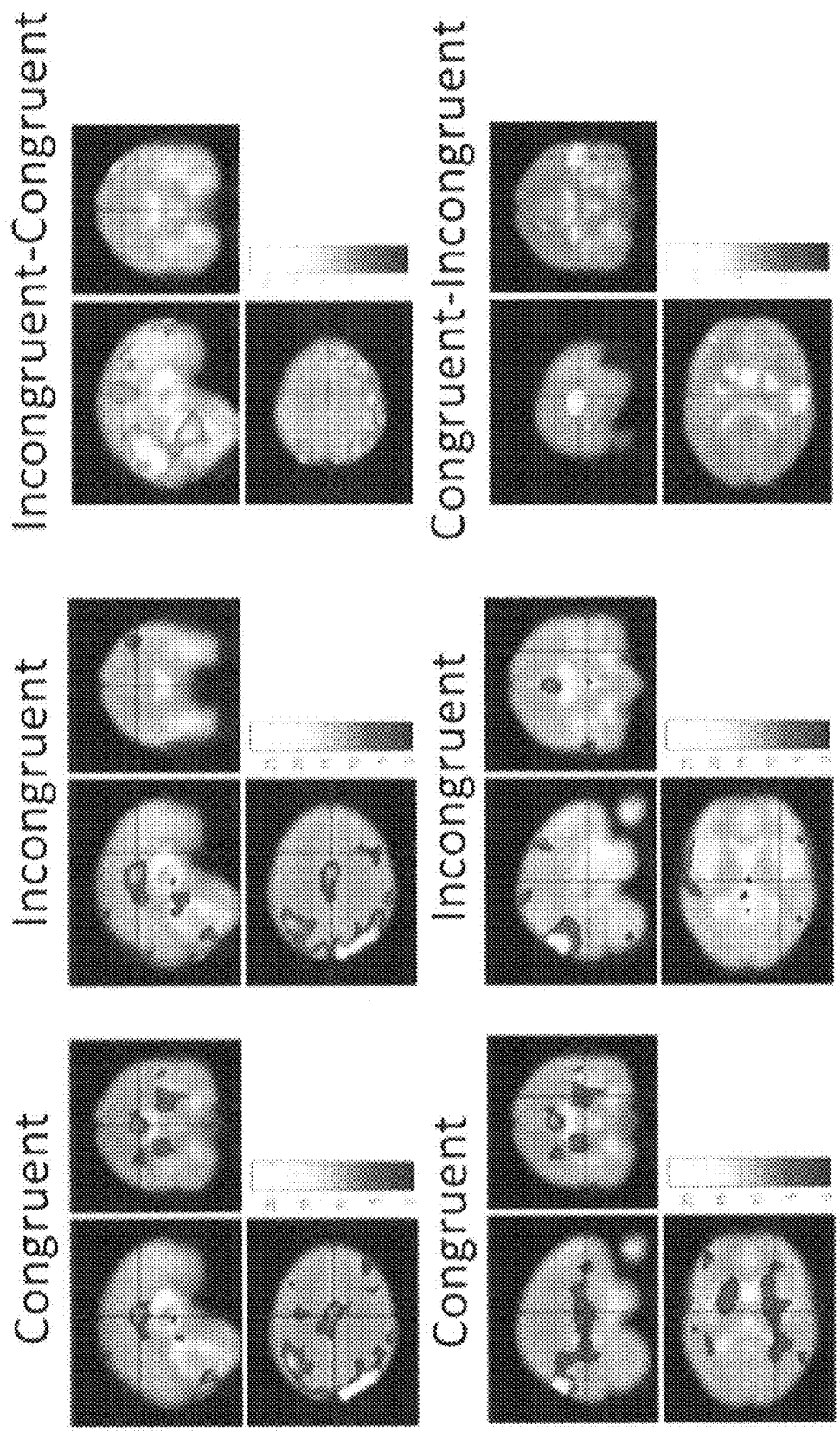
FIG. 6 illustrates single-subject activation maps of an event-related Stroop task overlaid on the Montreal Neurological Institute (MNI) brain template according to one embodiment of the present invention.

In the fourth experiment, averaged scans—24 single trials—showed strong activation in parietal cortex, prefrontal regions, in dorsal anterior cingulate (BA24) and in visual cortex on both congruent and incongruent trials versus baseline. FIG. 6 illustrates single-subject activation maps of an event-related Stroop task overlaid on the MNI brain template using inferential statistical analysis. Data were obtained with 2-slab EVI with TR=135 ms. Specifically, maximum t-scores in visual cortex reached 22.7 in congruent trials and 28.7 in incongruent trials, consistent with the strong BOLD sensitivity of multi-slab EVI seen in the first, second and third experiments. Congruent trials versus baseline showed additional activation in Putamen compared to incongruent trials. Incongruent trials versus baseline showed additional activation in temporal regions compared to congruent trials. Contrasting incongruent versus congruent trials revealed activation increases in dorsal parietal and dorsal frontal regions, fusiform gyrus and anterior cingulate, with maximum t-scores of 11.3. This is indicative of the considerably greater attentional and cognitive control demands inherent within incongruent trials. Contrasting congruent versus incongruent trials showed activation increases in putamen and in precentral gyrus (Brodman area 43) with maximum t-scores of 7.2. This overall pattern of activation in congruent and incongruent trials is also depicted in the task-correlated ICA map averaged across all trials as shown in FIG. 7.

Figure 7:
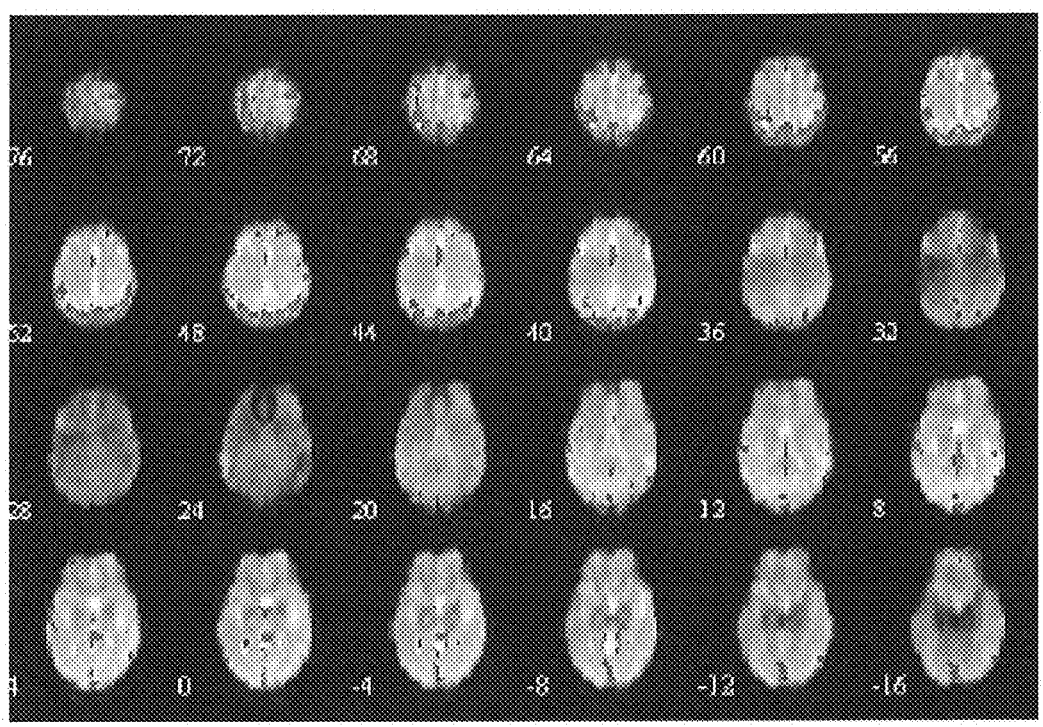
FIG. 7 illustrates independent component analysis of an event-related Stroop task in a single subject according to one embodiment of the present invention.

FIG. 7 illustrates independent component analysis of an event-related Stroop task in a single subject. Data were obtained with 2-slab EVI with TR=136 ms during a 106 s scan of 11 single trials. The task-correlated ICA map shows activation in parietal, motor, visual and frontal areas (including BA10 and BA24) overlaid on spatially normalized 2-slab EVI data.

Figure 8:
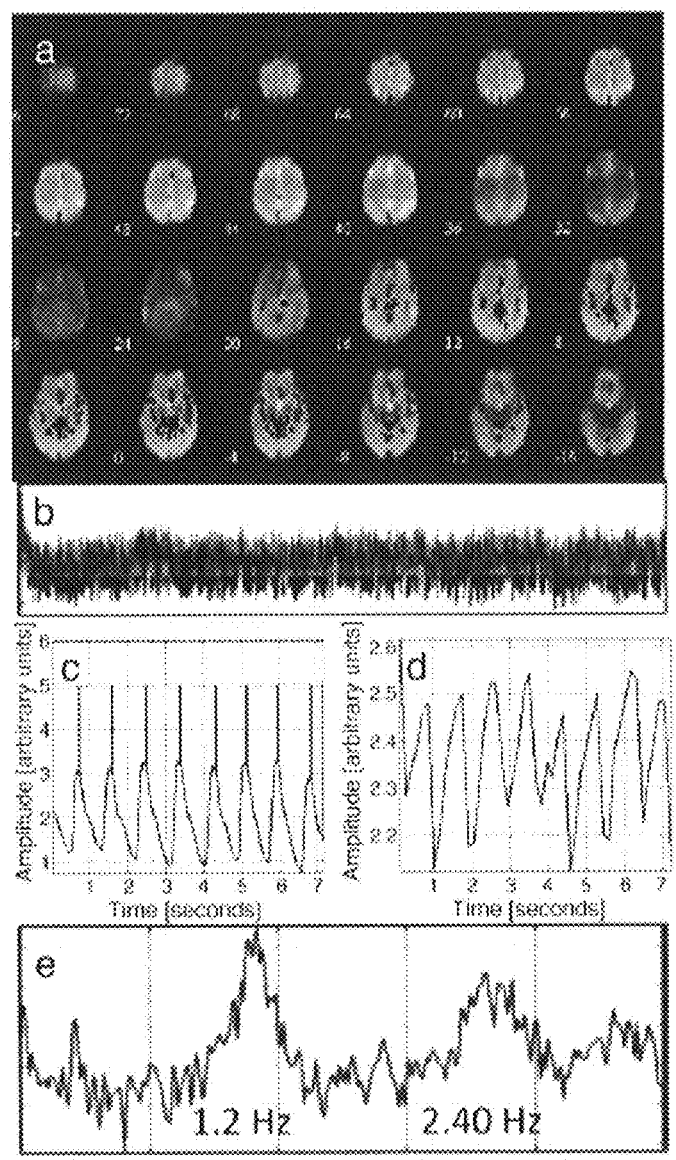
FIG. 8 illustrates physiological noise measured during a Stroop task using 2-slab EVI according to one embodiment of the present invention.

The remaining 4 ICA maps showed signal fluctuations correlated with heartbeat in brain stem and CSF containing spaces as shown in FIG. 8. Specifically, FIG. 8 illustrates physiological noise measured during a Stroop task using 2-slab EVI with TR=135 ms and 108 s scan). The fast sampling rate improved detection of cardiac related physiological noise components in the brain stem, in the insular cortex and in CSF containing spaces as shown in FIG. 8 and signal fluctuations correlated with respiration. The physiological recordings enabled unambiguous identification of physiological noise components in ICA analysis. Comparison of the pulse recordings and the signal time courses in cardiac-related ICA components showed that the time delays between corresponding pulsations in the two data traces were highly consistent during the entire duration of a scan. The power spectra of pulse recordings and cardiac-related ICA components (FIG. 8e) were similar up to the $2^{nd}$ harmonic.

Figure 9:
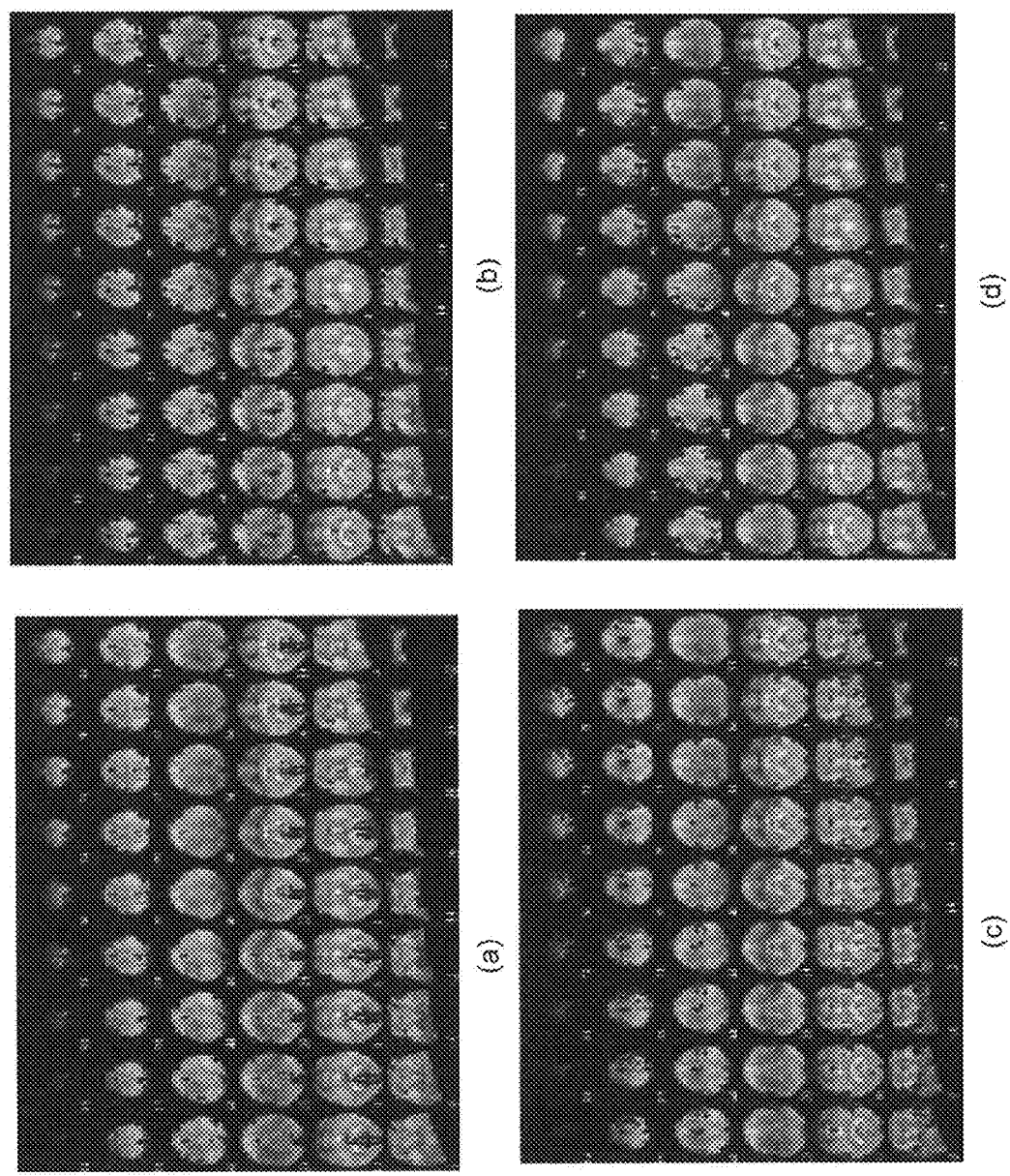
FIG. 9 illustrates major resting state networks detected in a single subject using 2-slab EVI according to one embodiment of the present invention.

Next resting state networks were detected. In the fifth experiment, ICA decomposed individual subject scan data into 25 to 32 components. Five major resting state networks were consistently detected in all subjects in single scans using 2-slab EVI with TR=136 ms as shown in FIG. 9. Specifically, FIG. 9(a) illustrates an occipital network (RSN1), FIG. 9(b) illustrates the so called default mode network—a midline network involving primarily precuneus and prefrontal lobe and parietal regions (RSN2), FIG. 9(c) illustrates a bilateral sensorimotor cortex (RSN3), which was overlapped with a network dominated by temporal and inferior prefrontal cortices (RSN5), and FIG. 9(d) illustrates dorsal parietal regions and lateral prefrontal cortex (RSN4). The spatial components are overlaid on spatially normalized raw data. These RSNs were associated with clearly identifiable slowly varying signal time courses that were well above noise level. Five additional minor RSNs with activation encompassing parietal, occipital, lateral prefrontal, temporal and inferior frontal regions (RSN6-9) were also detected, but variable across subjects (not shown). The majority of remaining components depicted signal fluctuation due to heartbeat and respiration, and signal instability at the edges of the slabs due to head movement. The detection of RSNs as a function of the total number of selected ICA maps was also investigated. Reducing the number of selected components to 14 in 2 of the subjects removed RSNs 6-9. It also removed RSN4 in one of the two subjects. Whether the 5 major resting state networks were detectable in shorter segments of the individual subject scans was also investigated. Time series data from one of the subjects were separated into segments with 1100 scans corresponding to 2 min 30 s scan time and into 4 consecutive segments with 550 scans corresponding to 75 s scan time. RSN1, RSN2, RSN3, RSN4 and RSN5 were detected in both 2 min 30 s segments and 75% of the 75 s segments as shown in FIG. 10. Specifically, FIG. 10 illustrates sensorimotor resting state networks detected in a single subject using 2-slab EVI with TR=136 ms for different scan durations. FIG. 10(a) illustrates a full scan at 4 min 59 s, FIG. 10(b) illustrates a simulated scan time of 2 min 30 s and FIG. 10(c) illustrates a simulated scan of 75 s.

Multi-slab EVI significantly increases t-scores of activation and BOLD signal amplitude compared to EPI, not only in large blood vessels, but also across extended functional areas in visual, motor and auditory cortex. These gains are expected to extend to frontal cortex, although they did not reach statistical significance in this study due to intra-subject variability in task performance. The high temporal resolution of multi-slab EVI enabled the use of a time domain moving average filter to reduce physiological signal fluctuations and to further increase t-scores and extent of activation compared to EPI, while maintaining an effective temporal resolution comparable to that of EPI.

The increase in BOLD signal amplitude was in part due to the longer readout duration of $1.3*T_2*$, which provides close to maximum BOLD sensitivity as previously shown for multi-echo EPI, while limiting geometrical distortion and blurring of the point spread function in the slice direction compared to conventional single-shot EVI. The long readout also increases the effective echo time for small structures, which increases BOLD contrast in focal areas of activation. The increases in BOLD signal amplitude compared to EPI were strongest in motor cortex, which exhibits more focal activation compared to visual cortex. These differences remained significant in the motor cortex even after moving average filtering, but not in the visual cortex.

This increase in t-scores is in part due to the improved Nyquist sampling of cardiac and respiration related signal fluctuation, which are major noise sources at high field strength. The fast sampling rate also more than compensates for the moderate 52% reduction in temporal SNR of 4-slab EVI compared to EPI.

The lack of autoregressive modeling in the data analysis introduces possible bias due to temporal correlations in the noise. The high temporal resolution of multi-slab EVI increases the number of time points by almost an order of magnitude compared to conventional EPI, which with standard GLM analysis and without prewhitening increases the t-scores. In a preliminary analysis, the effect of prewhitening was investigated. In case of 2-slab EVI data prewhitening reduced the t-scores by as much as 42% compared to data processed without prewhitening.

In the absence of appropriate noise models in the data analysis methodology an upper bound is estimated for the effect of the increased sampling rate on the t-scores using the 4-slab EVI data analyzed with the moving average filter. Assuming that the moving average filter introduces strong temporal correlations, which reduce the effective degrees of freedom of 4-slab EVI to those of EPI (an overestimation), the t-scores measured with the moving average filter were rescaled using a correction factor of $\sqrt{TR_{EVI}/TR_{EPI}}$. The rescaled mean and maximum t-scores in visual cortex were still 12% and 82% larger than those of EPI. The rescaled mean t-score in motor cortex was similar to that of EPI, while the rescaled maximum t-score was still 13% larger than those of EPI. These results suggest that the increase in t-scores with multi-slab EVI can only in part be explained by an apparent increase in degrees of freedom due to the high sampling rate alone.

Multi-slab EVI is also considerably less sensitive to physiological noise than segmented 3D EPI methods, which are affected by signal fluctuations between segments that lead to signal incoherence in k-space. These lead to ghosting and increase apparent physiological signal fluctuation. Multi-slab EVI employs significantly longer TR than segmented 3D EPI methods, which further increases the sensitivity advantage and reduces steady state effects.

Signal decreases at the intersections of slabs introduce heterogeneity in spatial coverage and BOLD sensitivity. Using RF pulse design with uniform phase response in the transition region limits signal de-phasing during excitation of adjacent slabs. Coherent averaging of slices in the transition region that are encoded by the adjacent slabs would minimize overall signal losses.

The reduction in temporal resolution compared to single-shot EVI is due to the repetitions of the lipid suppression and excitation modules for each slab and due to spatial oversampling in the slice direction within each slab. However, multi-slab EVI is advantageous at high field, since it mitigates the gradient performance limitations that result in excessive readout durations with single-shot EVI. Spatial oversampling of the slab is associated with a 25% increase in acquisition time in the implementation using 8-slice encoding across a slab that covers 6 slices. Larger matrix size in the $k_z$-direction up to 16 slices is feasible at the expense of increased effective TE.

The fast sampling of the physiological noise is advantageous for detecting the onset of task-related BOLD signal changes and delineation of non-task related BOLD signal changes. As the present invention illustrates, it is possible to measure task-related signal changes well above noise level in single non-averaged trials that closely match the commonly employed canonical hemodynamic response model, leading to very high correlation coefficients and t-scores. This high contrast-to-noise ratio and the high temporal resolution of multi-slab EVI are thus suitable for characterizing hemodynamic onset times in different brain regions.

The high temporal resolution and sensitivity of multi-slab EVI comes at the price of increased geometrical distortion and spatial blurring of the BOLD response compared to EPI. Multi-slab EVI represents a compromise that provides high sensitivity while limiting geometrical distortion and spatial blurring at only moderate reduction of acquisition speed compared to single-shot EVI. The spatial resolution is limited by the spatial encoding capabilities of the 12-channel head array coil. Using a 32 channel head array coils in conjunction with 2-dimensional parallel imaging would enable larger overall acceleration factors to achieve isotropic spatial resolution of 3 mm, which is more typical for fMRI studies, and reduction of g-factor related noise enhancement.

Although the high temporal resolution of multi-slab EVI minimizes intra-scan motion artifacts, the long readout makes multi-slab EVI sensitive to head movement related geometrical distortion and image intensity changes. To correct head movement related image distortion, it is contemplated that prospective acquisition correction (PACE) with dynamic shimming can be implemented.

The high temporal resolution of multi-slab EVI eliminates the need to jitter the onset of individual events. The high BOLD sensitivity is advantageous for detecting event-related activation in single subjects. Sensitive detection of five major RSNs in single subjects is facilitated by the high BOLD sensitivity and high temporal resolution of multi-slab EVI.

While the present invention and what is considered presently to be the best modes thereof have been described in a manner that establishes possession thereof by the inventors and that enables those of ordinary skill in the art to make and use the inventions, it will be understood and appreciated that there are many equivalents to the exemplary embodiments disclosed herein and that myriad modifications and variations may be made thereto without departing from the scope and spirit of the invention, which is to be limited not by the exemplary embodiments but by the appended claims.

The invention claimed is:

1. A method of performing functional magnetic resonance imaging, comprising the steps of:
    exciting multiple adjacent slabs sequentially, wherein each slab comprises a plurality of image slices;
    encoding each slab of the multiple adjacent slabs in a single-shot three-dimensional measurement to resolve the plurality of image slices within each slab to obtain individual encoded slabs;
    minimizing inter-slab crosstalk to avoid spatial aliasing and to minimize signal losses at the edges of each individual encoded slab by using numerically optimized slab selection radio frequency pulses and spatial oversampling of image slices located on either side of each individual encoded slab;
    undersampling the k-space data acquisition;
    creating an un-aliased image from each individual encoded slab utilizing parallel imaging;
    reconstructing a final contiguous volumetric image from all individual encoded slabs including the plurality of image slices.

2. The method of performing functional magnetic resonance imaging according to claim 1, wherein said exciting step is performed on the multiple adjacent slabs in ascending order.

3. The method of performing functional magnetic resonance imaging according to claim 1, wherein said exciting step is performed on the multiple adjacent slabs in descending order.

4. The method of performing functional magnetic resonance imaging according to claim 1, wherein said exciting step is performed on the multiple adjacent slabs in interleaved order.

5. The method of performing functional magnetic resonance imaging according to claim 1, wherein said encoding step further comprises the step of using GRAPPA acceleration.

6. The method of performing functional magnetic resonance imaging according to claim 1, wherein said encoding step further comprises the step of using SENSE acceleration.

7. The method of performing functional magnetic resonance imaging according to claim 1, wherein said reconstructing step further includes the step of utilizing Hamming filtering, Fourier transformation, slice ordering and concatenation of stacks of the plurality of slices.

8. The method of performing functional magnetic resonance imaging according to claim 1, wherein fMRI analysis is performed using a moving time domain filter.

* * * * *